United States Patent

Park et al.

(10) Patent No.: US 9,214,606 B2
(45) Date of Patent: Dec. 15, 2015

(54) METHOD OF MANUFACTURING LIGHT-EMITTING DIODE PACKAGE

(71) Applicant: SAMSUNG ELECTRONICS CO., LTD., Suwon-si, Gyeonggi-do (KR)

(72) Inventors: Il-woo Park, Suwon-si (KR); Jong-rak Sohn, Hwaseong-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 0 days.

(21) Appl. No.: 14/203,191

(22) Filed: Mar. 10, 2014

(65) Prior Publication Data

US 2014/0256071 A1    Sep. 11, 2014

(30) Foreign Application Priority Data

Mar. 11, 2013 (KR) .................. 10-2013-0025749

(51) Int. Cl.
| | | |
|---|---|---|
| H01L 21/00 | (2006.01) | |
| H01L 33/46 | (2010.01) | |
| H01L 33/60 | (2010.01) | |
| H01L 33/38 | (2010.01) | |
| H01L 23/00 | (2006.01) | |
| H01L 33/50 | (2010.01) | |
| H01L 33/48 | (2010.01) | |

(52) U.S. Cl.
CPC ............. *H01L 33/46* (2013.01); *H01L 24/32* (2013.01); *H01L 33/38* (2013.01); *H01L 33/502* (2013.01); *H01L 33/60* (2013.01); H01L 33/486 (2013.01); H01L 33/50 (2013.01); H01L 2224/32245 (2013.01); H01L 2224/48091 (2013.01); H01L 2224/48247 (2013.01); H01L 2224/73265 (2013.01); H01L 2224/92247 (2013.01); H01L 2924/12041 (2013.01); H01L 2924/1815 (2013.01); H01L 2933/0025 (2013.01)

(58) Field of Classification Search
CPC ......... H01L 33/60; H01L 33/50; H01L 33/52; H01L 33/54; H01L 33/46; H01L 33/502; H01L 33/504; H01L 33/36; H01L 33/38; H01L 33/64; H01L 2924/12401
USPC .......... 438/27, 22, 24, 29, 25, 62; 257/98, 99, 257/88, 100
See application file for complete search history.

(56) References Cited

U.S. PATENT DOCUMENTS

| | | | |
|---|---|---|---|
| 6,775,310 B2* | 8/2004 | Sai et al. ................... | 372/45.01 |
| 7,490,959 B2* | 2/2009 | Tsuda ...................... | 362/267 |
| 8,232,564 B2* | 7/2012 | Chakraborty ............ | 257/88 |
| 8,278,668 B2* | 10/2012 | Kim ......................... | 257/79 |
| 2006/0091788 A1* | 5/2006 | Yan .......................... | 313/502 |
| 2012/0161113 A1* | 6/2012 | Lowenthal et al. ...... | 257/40 |

FOREIGN PATENT DOCUMENTS

| | | |
|---|---|---|
| JP | 2005-302747 A | 10/2005 |
| JP | 2006-191068 A | 7/2006 |
| JP | 2007-165726 A | 6/2007 |
| JP | 2007-246341 A | 9/2007 |
| KR | 10-0862453 B1 | 10/2008 |
| KR | 10-2009-0086781 A | 8/2009 |

\* cited by examiner

*Primary Examiner* — Michael Trinh
(74) *Attorney, Agent, or Firm* — McDermott Will & Emery LLP

(57) ABSTRACT

A method of manufacturing a light-emitting diode package is illustrated. A light-emitting diode chip is manufactured. A material layer is formed on side surfaces and a rear surface of the light-emitting diode chip. The material layer is then oxidized to convert the material layer into an oxidized layer to form a reflective layer on the side surfaces and the rear surface of the light-emitting diode chip. The light-emitting diode chip is packaged.

23 Claims, 15 Drawing Sheets

METHOD OF MANUFACTURING LIGHT-EMITTING DIODE PACKAGE

CROSS-REFERENCE TO RELATED APPLICATIONS

This application claims the benefit of priority to Korean Patent Application No. 10-2013-0025749, filed on Mar. 11, 2013, in the Korean Intellectual Property Office, the disclosure of which is incorporated herein in its entirety by reference.

BACKGROUND

The inventive concept relates to a method of manufacturing a light-emitting diode package, and more particularly, to a method of manufacturing a light-emitting diode package that reduces optical loss to improve light extraction efficiency.

Light-emitting diode chips emit light by combining electrons and holes in an active layer of compound semiconductors. The light-emitting diode chips may be packaged and used. Due to structures and manufacturing methods of light-emitting diode packages, optical loss may occur in light emitted from the light-emitting diode packages. Therefore, there is a need for a manufacturing method or structural technology of light-emitting diode packages that reduce optical loss when light is emitted to outer areas to improve light extraction efficiency.

SUMMARY

The inventive concept provides a method of manufacturing a light-emitting diode package that reduces optical loss to improve light extraction efficiency.

According to an aspect of the inventive concept, a method of manufacturing a light-emitting diode package is provided. A light-emitting diode chip including side surfaces, a light-emitting surface, and a rear surface opposed to the light-emitting surface of the light-emitting diode chip is manufactured. A material layer is formed on the side surfaces and the rear surface of the light-emitting diode chip, The material layer is then oxidized to convert the material layer into an oxidized layer to form a reflective layer on the side surfaces and the rear surface of the light-emitting diode chip. The light-emitting diode chip is then packaged.

The manufacturing of the light-emitting diode chip may include forming a light-emitting structure on a supporting layer, in which the reflective layer may be formed on side surfaces and a rear surface of the supporting layer and side surfaces of the light-emitting structure. The reflective layer may be formed in a continuous layer along the rear surface of the supporting layer, the side surfaces of the supporting layer and the side surfaces of the light-emitting structure. The supporting layer may be a substrate for epitaxial growth, a metal layer or a conductive material layer.

The forming of the material layer on the side surfaces and the rear surface of the light-emitting diode chip may include mounting the light-emitting diode chip on a carrier substrate, such that a light-emitting surface of the light-emitting diode chip is facing downward; and forming the reflective layer on the side surfaces and the rear surface of the light-emitting diode chip.

The method according to an aspect of the inventive concept may further include performing heat treatment on the reflective layer, after the reflective layer is formed.

The packaging of the light-emitting diode chip may include forming a phosphor layer on the light-emitting surface of the light-emitting diode chip; mounting the light-emitting diode chip on a wiring substrate, such that the phosphor layer of the light-emitting diode chip is facing upward; electrically connecting the light-emitting diode chip, which has the phosphor layer formed thereon, and the wiring substrate by using an electrical connecting member; and forming a molding material for molding around the light-emitting diode chip to cover side surfaces of the phosphor layer while exposing the light-emitting surface.

The material layer may include a metal layer or a silicon layer.

According to another aspect of the inventive concept, a method of manufacturing a light-emitting diode package is provided. The method includes manufacturing a light-emitting diode chip; forming a metal layer on side surfaces and a rear surface of the light-emitting diode chip; oxidizing the metal layer to convert the metal layer into an oxidized layer to form a reflective layer on the side surfaces and the rear surface of the light-emitting diode chip; and preparing a wiring substrate including a mounting member, which has a surface on which the light-emitting diode chip may be mounted, a flat surface member, which is a flat surface extended from side surfaces of the mounting member, and a reflective cup, which is extended upward from the flat surface member; and mounting the light-emitting diode chip, on which the reflective layer is formed, on the mounting member of the wiring substrate, and packaging the light-emitting diode chip.

The packaging of the light-emitting diode chip may include mounting the light-emitting diode chip on a wiring substrate such that a phosphor layer of the light-emitting diode chip is facing upward; electrically connecting the light-emitting diode chip and the wiring substrate by using an electrical connecting member; forming a phosphor layer on the light-emitting surface and the reflective layer; and forming a molding material for molding around the light-emitting diode chip.

The method according to another aspect of the inventive concept may further include forming a second reflective layer on the flat surface member. The reflective layer may be formed in a continuous layer along the rear surface of the supporting layer, the side surfaces of the supporting layer, and the side surfaces of the light-emitting structure.

According to an aspect of the inventive concept, an exemplary method for manufacturing a light-emitting diode package is provided. A light-emitting diode chip including side surfaces, a light-emitting surface, and a rear surface opposed to the light-emitting surface of the light-emitting diode chip is manufactured. A reflective layer is formed on the side surfaces and the rear surface of the light-emitting diode chip. A wiring substrate is prepared. The wiring substrate includes a mounting member, a flat surface member, and a reflective cup. The flat surface member extends to side surfaces of the mounting member and the reflective cup extends upward from the flat surface member. The light-emitting diode chip with the reflective layer is mounted on the mounting member of the wiring substrate. The light-emitting diode chip is packaged. In the exemplary method, the light-emitting diode chip can be mounted on a carrier substrate such that the light-emitting surface of the light-emitting diode chip is facing downward and the rear surface of the light-emitting diode chip is facing upward. Further, heat treatment may be performed on the reflective layer, after the reflective layer is formed. Furthermore, the light-emitting diode chip can be mounted on the wiring substrate such that a phosphor layer of the light-emitting diode chip is facing upward. The light-emitting diode chip and the wiring substrate are connected via one or more electrical connecting members and a phosphor layer may be formed on the light-emitting surface of the light-emitting diode chip and the reflective layer. A molding material may be formed for molding around the light-emitting diode chip to cover side surfaces of the phosphor layer while exposing the light-emitting surface of the light-emitting diode chip.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
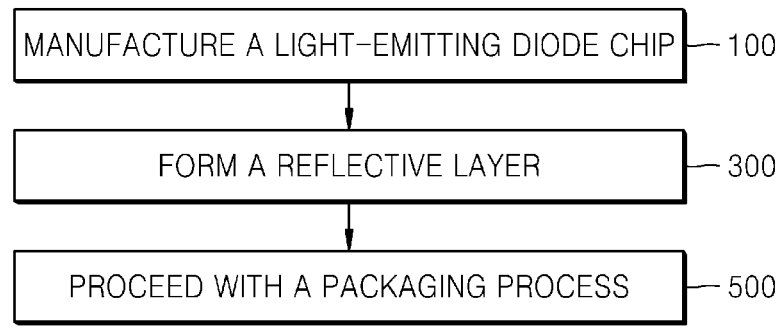
FIG. 1 is a flowchart illustrating a method of manufacturing a light-emitting diode package according to an embodiment of the inventive concept.

The inventive concept will now be described more fully with reference to the accompanying drawings, in which exemplary embodiments of the inventive concept are shown. The same elements in the drawings are denoted by the same reference numerals and a repeated explanation thereof will be omitted.

The inventive concept now will be described more fully hereinafter with reference to the accompanying drawings, in which elements of the inventive concept are illustrated. The inventive concept may, however, be embodied in many different forms and should not be construed as being limited to the exemplary embodiments set forth herein. Rather, these exemplary embodiments are provided so that this disclosure will be thorough and complete, and will fully convey the scope of the inventive concept to one of ordinary skill in the art.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept. For example, a first element may be named a second element and similarly a second element may be named a first element without departing from the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In other embodiments, a specific order of processes may be changed. For example, two processes which are continuously explained may be substantially simultaneously performed and may be performed in an order opposite to that explained.

Variations from the shapes of the illustrations as a result, for example, of manufacturing techniques and/or tolerances, are to be expected. Thus, exemplary embodiments should not be construed as being limited to the particular shapes of regions illustrated herein but may include deviations in shapes that result, for example, from manufacturing. The inventive concept described hereinafter may be implemented by taking the form of any one of the exemplary embodiments, or a combination thereof.

As used herein, expressions such as "at least one of," when preceding a list of elements, modify the entire list of elements and do not modify the individual elements of the list.

FIG. 1 is a high level flowchart illustrating a method of manufacturing a light-emitting diode package according to an embodiment of the inventive concept.

Specifically, the exemplary method of manufacturing the light-emitting diode package according to an embodiment of the inventive concept includes manufacturing a light-emitting diode chip (operation 100). The light-emitting diode chip may be a blue light-emitting diode chip, which emits blue light. The light-emitting diode chip may also emit light of different colors such as red, yellow or green. The operations of manufacturing the light-emitting diode chip and the structure thereof will be described in detail with reference to FIGS. 2A through 2C.

After the light-emitting diode is manufactured, a reflective layer is formed on side surfaces and a rear surface of the light-emitting diode chip (operation 300). The forming process of the reflective layer will be described in detail with reference to FIGS. 3A through 3C and FIGS. 4A through 4C. The structure of the light-emitting diode chip including the reflective layer and the effect of the reflective layer will be described with reference to FIGS. 5A through 5C.

After the reflective layer is formed, the light-emitting diode chip is packaged (operation 500). The light-emitting diode chip may be packaged by one or more embodiments of the inventive concept, and the packaging process may be modified in various ways.

Figure 2A:
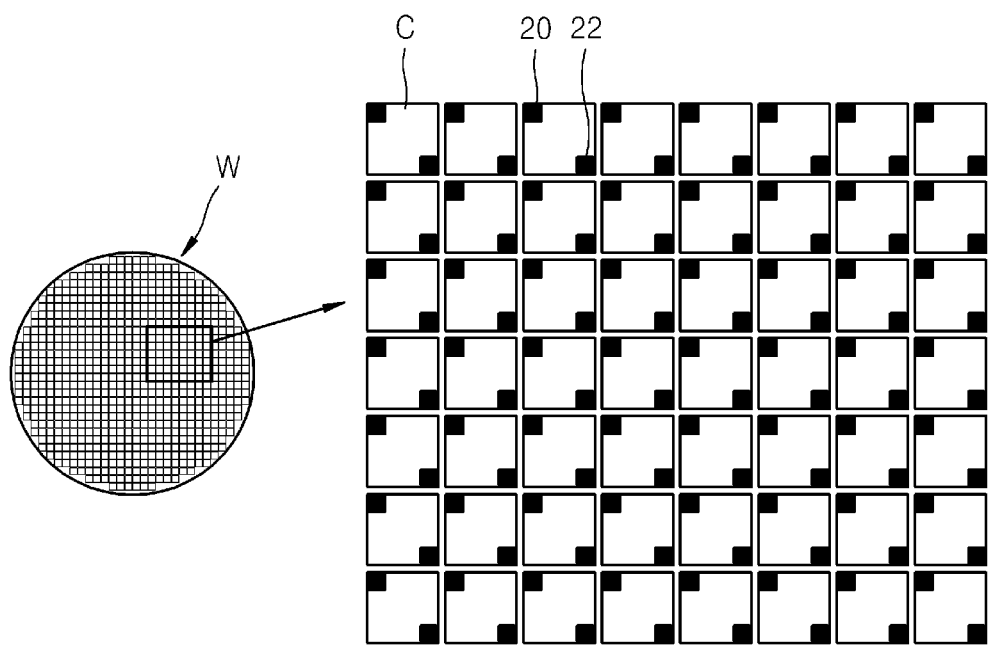
FIGS. 2A through 2C are views illustrating an exemplary light-emitting diode chip of FIG. 1.
Figure 2B:
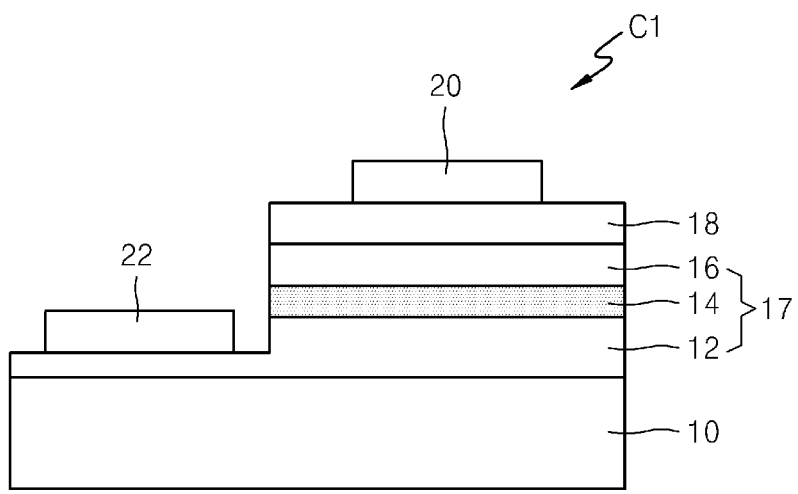
Figure 2C:
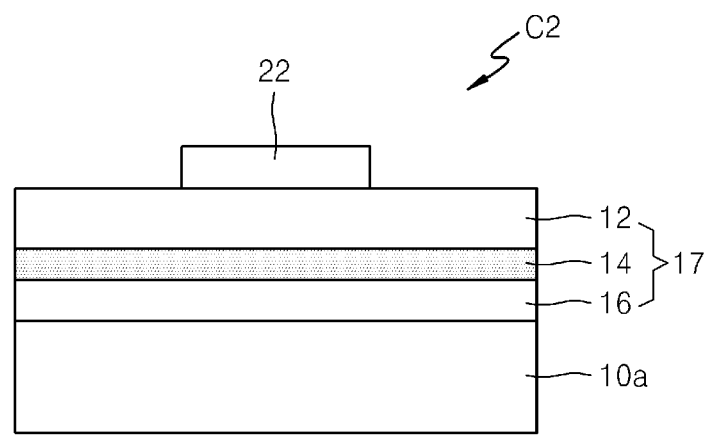

FIGS. 2A through 2C illustrate how a light-emitting diode chip of FIG. 1 is manufactured;

FIG. 2A is a plane view of a wafer W including a plurality of light-emitting diode chips C according to an embodiment of the inventive concept. FIG. 2B is a cross-sectional view of a light-emitting diode chip C1 according to an embodiment of the inventive concept. FIG. 2C is a cross-sectional view of a light-emitting diode chip C2 according to another embodiment of the inventive concept. FIGS. 2A through 2C are schematic views of the light-emitting diode chips C, C1 and C2. For discussion purposes, the illustrated structures of the light-emitting diode chips C, C1 and C2 are simplified by omitting structural elements such as passivation layers for insulating electrode pads.

Referring to FIG. 2A, first, as a basic semiconductor process, a plurality of light-emitting diode chips C are formed on the wafer W. Then, the plurality of light-emitting diode chips C each include electrode pads 20 and 22 and may be formed on a single wafer W (also referred herein as "horizontal light-emitting diode chips"). As illustrated in FIG. 2A, the horizontal light-emitting diode chips C may be in the form of squares, and each light-emitting diode chip C includes the electrode pads 20 and 22 formed on corners of the light-emitting diode chip C. The electrode pads 20 and 22 may be n-type and p-type electrode pads, respectively. Further, as shown in FIG. 2C, a light-emitting diode chip C2 may include only one electrode pad 22 (also referred herein as a "vertical light-emitting diode chip").

FIG. 2B is an expanded view of an example of a cross-section of the light-emitting diode chip C of FIG. 2A. Specifically, FIG. 2B illustrates the horizontal light-emitting diode chip C1. The horizontal light-emitting diode chip C1 includes a light-emitting structure 17 comprising a first conductive semiconductor layer 12, an active layer 14, and a second conductive semiconductor layer 16. The horizontal light-emitting diode chip C1 further includes a first conductive electrode pad 22 and a second conductive electrode pad 20. When supplying power to the horizontal light-emitting diode chip C1, current between the first and second conductive electrode pads 22 and 20 may flow from the left to the right, that is, horizontally. In FIG. 2B, the upper region is the light-emitting surface.

In the horizontal light-emitting diode chip C1, the first-conductive semiconductor layer 12, for example, an n-type semiconductor layer, may be mounted on a supporting layer 10, such as a substrate. The supporting layer 10 may be a substrate for epitaxial growth, and may be formed of silicon (Si), silicon carbide (SiC), or sapphire. The supporting layer 10 may be a substrate formed of materials that are suitable for epitaxial growth of the first conductive semiconductor layer 12, such as ZnO, GaAs, MgAl$_2$O$_4$, MgO, LiAlO$_2$, LiGaO$_2$, GaN.

The first conductive semiconductor layer 12 may be formed of a group III-V nitride semiconductor material. For example, the first conductive semiconductor layer 12 may be formed of a semiconductor material having a composition represented by Al$_x$Ga$_y$In$_z$N ($0 \leq x \leq 1$, $0 \leq y \leq 1$, $0 \leq z \leq 1$, and $x+y+z=1$) doped with n-type impurities. Examples of n-type impurities may include Si, Ge, Se, and Te.

The first conductive electrode pad 22 may be formed on one side of the conductive semiconductor layer 12. The first conductive electrode pad 22 may be an n-type electrode pad. In addition, the active layer 14 may be formed on the first conductive semiconductor layer 12. The active layer 14 emits light due to recombinations of electrons and holes, and may be formed in a single quantum well or a multi-quantum well structure, which has been formed by periodically changing an x-value, a y-value, and a z-value of Al$_x$Ga$_y$In$_z$N to adjust a band gap. For example, the quantum well and quantum barrier may be in structures such as InGaN/GaN, InGaN/InGaN, InGaN/AlGaN, or InGaN/InAlGaN. Also, according to a mole fraction of In in an InGaN layer, the band gap energy may be controlled to adjust a light-emitting wavelength band. If the mole fraction of In changes by about 1%, the light-emitting wavelength band may shift by about 5 nm.

The second conductive semiconductor layer 16, for example, a p-type semiconductor layer, may be mounted on the active layer 14. The second conductive semiconductor layer 16 may cover an entire surface of the active layer 14. The second conductive semiconductor layer 16 may be formed of a semiconductor material having a composition represented by p-Al$_x$Ga$_y$In$_z$N(x+y+z=1) ($0 \leq x \leq 1$, $0 \leq y \leq 1$, $0 \leq z \leq 1$, and x+y+z=1) doped with n-type impurities. Examples of the p-type impurities may include Mg, Zn, and Be.

A transparent electrode layer 18 may be formed on the second conductive semiconductor layer 16. When necessary, the transparent electrode layer 18 may be selectively formed. The transparent electrode layer 18 may be formed of Ni/Ito, Ni/Au/Ito, ITO, Ni/ZnO, or ZnO. The second conductive electrode pad 20 is formed on the transparent electrode layer 18, and may be a p-type electrode pad. Material layers of the light-emitting diode chip C may be formed by using hydride vapor phase epitaxy (HYPE), molecular beam epitaxy (MBE), metal organic vapor phase epitaxy (MOVPE), or metal organic chemical vapor deposition (MOCVD).

FIG. 2C is an expanded view of a cross-section of the exemplary light-emitting diode chip C of FIG. 2A. Specifically, FIG. 2C illustrates a vertical light-emitting diode chip C2. For the discussion purposes, the detailed description of elements of FIG. 2C that are identical to those of FIG. 2B will be omitted. As in FIG. 2B, the upper portion of FIG. 2C represents the light-emitting surface. In FIG. 2C, epi-layers, which include the light-emitting structure 17, and a supporting layer 10a are formed on the wafer W. Then, the wafer W may be separated from the epi-layers and supporting layer 10a so that the light-emitting structure 17 may be mounted on the supporting layer 10a.

The supporting layer 10a may be formed as a metal layer or a conductive material layer. The conductive material layer may be formed of a material having high electrical conductivity. Each conductive material layer may be formed of Au, Sn, Pb, Ag, In, Ge, Si, or any combination thereof. Also, the conductive material layer may be formed of a u-Sn alloy, a Pb—Ag—In alloy, a Pb—Ag—Sn alloy, a Pb—Sn alloy, an Au—Ge alloy, an Au—Si alloy, or Au.

Therefore, in comparison to FIG. 2B, the light-emitting structure 17 is formed by mounting the second conductive semiconductor layer 16, the active layer 14, and the first conductive semiconductor layer 12 on the supporting layer 10a. The supporting layer 10a of vertical light-emitting diode chip C2 may be formed of an electrode, and the first conductive electrode pad 22 may be formed on the first conductive semiconductor layer 12. The vertical light-emitting diode chip C2 includes the light-emitting structure 17, the first conductive electrode pad 22, and the supporting layer 10a. When supplying power to the vertical light-emitting diode chip C2, current between the first conductive electrode pad 22 and the supporting layer 10a may vertically flow up and down.

Figure 3A:
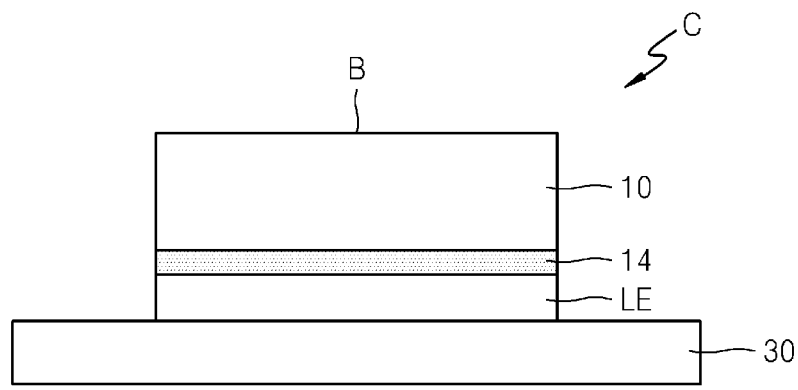
FIGS. 3A through 3C are cross-sectional views illustrating manufacture of a reflective layer of FIG. 1, according to an embodiment of the inventive concept.
Figure 3B:
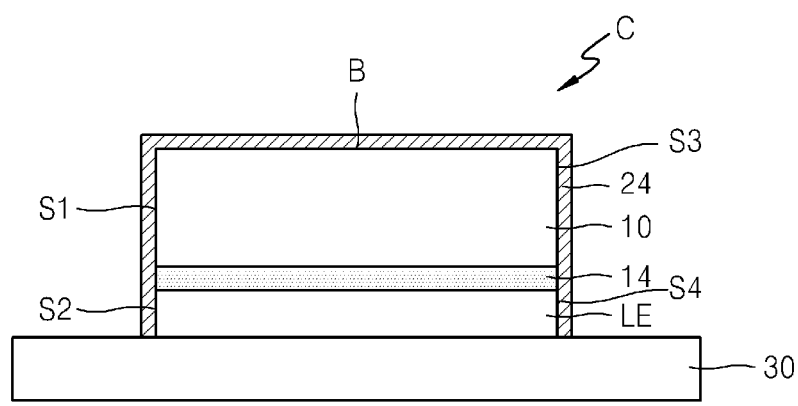
Figure 3C:
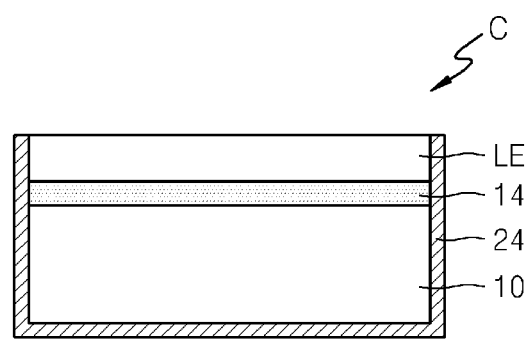

FIGS. 3A through 3C are cross-sectional views illustrating operations of manufacturing the reflective layer of FIG. 1 (operation 300), according to an embodiment of the inventive concept. For discussion purposes, in FIGS. 3A through 3C, the reference numeral of the supporting layer of the light-emitting diode chip C will be 10, and only the active layer 14 will be illustrated for convenience.

As illustrated in FIG. 3A, the light-emitting diode chip C as described in reference to FIGS. 2A through 2C is mounted on a carrier substrate 30 and has a light-emitting surface LE facing downward. In other words, the light-emitting diode chip C is mounted on the carrier substrate 30, having a rear side B thereof facing upward. The carrier substrate 30 may be formed by using a tape including an adhesive layer.

Next, as illustrated in FIG. 3B, a reflective layer 24 is formed on side surfaces S1 and S3, side surfaces S2 and S4, and the rear surface B of the light-emitting diode chip C. The reflective layer 24 may be formed in a continuous layer along the rear surface B of the supporting layer 10, which is on the opposite side of the light-emitting layer LE, the side surfaces S1 and S3 of the supporting layer 10, and the side surfaces S2 and S4 of the light-emitting structure which includes the active layer 14. The reflective layer 24 may be formed in a uniform thickness. The thickness of the reflective layer 24 may range from about 100 nm to about 10 μm.

The reflective layer 24 may be formed as a metal layer. The metal layer composing the reflective layer 24 may be formed by using an electron beam evaporation, sputtering, or chemical vapor deposition (CVD) technique. Al or Au may be used to form the metal layer.

The reflective layer 24 may be formed as an oxidized layer. The oxidized layer comprising the reflective layer 24 may be formed of titanium oxide ($TiO_2$), aluminum oxide ($Al_2O_3$), silicon oxide ($SiO_2$), or tantalum oxide ($Ta_2O_5$).

When the metal layer or the oxidized layer comprising the reflective layer 24 is formed, heat treatment may be performed on the metal layer or the oxidized layer, and thus the metal layer or the oxidized layer may be crystallized, or crystallizability thereof may be increased to improve reflectivity. The heat treatment may be executed in a temperature range of about 300° C. to about 800° C.

Next, as shown in FIG. 3C, the carrier substrate 30 is removed, and then the light-emitting diode chip C, on which the reflective layer 24 is formed, is flipped over so that the light-emitting surface LE thereof faces upward. By following the operations described above, the light-emitting diode chip C including the reflective layer 24 may be manufactured.

Figure 4A:
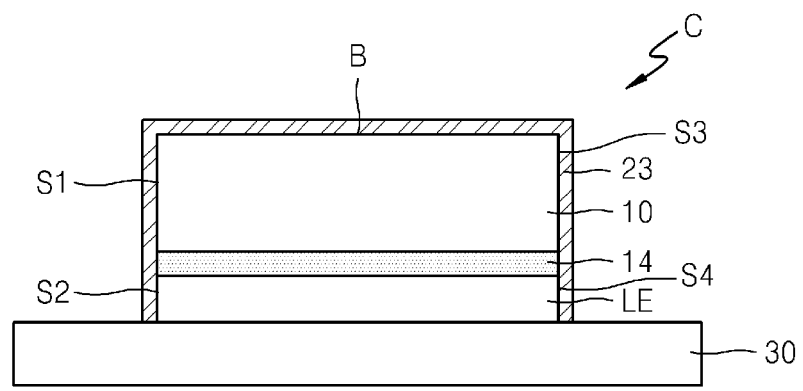
FIGS. 4A through 4C are cross-sectional views illustrating manufacture of a reflective layer of FIG. 1, according to an embodiment of the inventive concept.
Figure 4B:
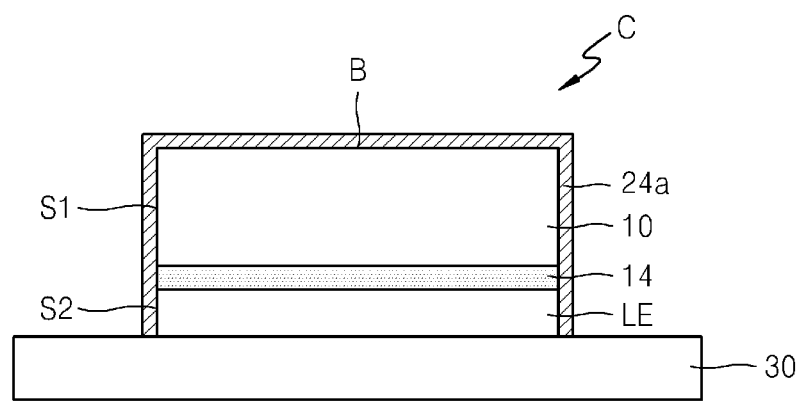
Figure 4C:
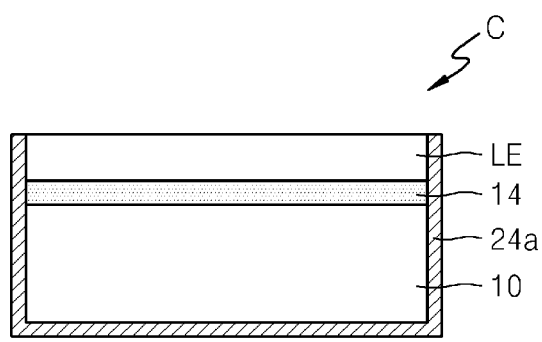

FIGS. 4A through 4C are exemplary cross-sectional views illustrating operations of manufacturing of the reflective layer as shown in FIG. 1 (operation 300), according to an exemplary embodiment of the inventive concept. For the convenience of description, in FIGS. 4A through 4C, the reference numeral of the supporting layer of the light-emitting diode chip C will be 10, and only the active layer 14 will be illustrated for convenience.

As noted above, in FIG. 4A, the light-emitting diode chip C is mounted on the carrier substrate 30, the light-emitting surface LE of the light-emitting diode chip C faces downward, and the rear surface B of the light-emitting diode chip C faces upward.

Then, as illustrated in FIG. 4A, a material layer 23 is formed on the both side surfaces S1 and S3, both side surfaces S2 and S4, and the rear surface B of the light-emitting diode chip C. The material layer 23 may be formed as a metal layer such as, a titanium (Ti) layer, an aluminum (Al) layer, a tantalum (Ta) layer, a silver (Ag) layer, or a silicon layer. The material layer 23 may be formed on the side surfaces S1, S3 and rear surface B of the supporting layer 10, and the side surfaces S2 and S4 of the light-emitting structure 17.

The material layer 23 may be formed in a continuous layer along and/or on the rear surface of the supporting layer 10, which is on the opposite side of the light-emitting layer LE, the side surfaces S1 and S3 of the supporting layer 10, and the side surfaces S2 and S4 of the light-emitting structure, which includes the active layer 14. The material layer 23 may be formed in a uniform thickness. The thickness of the reflective layer 23 may range from about 100 nm to about 10 μm.

Next, as shown in FIG. 4B, the material layer 23 is oxidized to form an oxidized layer and subsequently form a reflective layer 24a. That is, the material layer 23 is oxidized into the reflective layer 24a. The oxidized layer comprising the reflective layer 24a may be a titanium oxide ($TiO_2$) layer, an aluminum oxide ($Al_2O_3$) layer, a silicon oxide ($SiO_2$) layer, a tantalum oxide ($Ta_2O_5$) layer, or a silver oxide (AgO) layer.

Oxidizing the material layer 23 can be done in various ways. By way of example, the material layer 23 may be oxidized by dipping the material layer 23 in high-temperature deionized water for a predetermined time, for example, for about 10 minutes to about 1 hour. Also, the material layer 23 may be oxidized by disposing the light-emitting diode chip C including the material layer 23 in a vacuum chamber of an oxygen atmosphere, a high-pressure oxygen atmosphere, or a water vapor ($H_2O$) atmosphere.

When an oxidized layer comprising the reflective layer 24a is formed, heat treatment may be performed on the metal layer or the oxidized layer so that the metal layer or the oxidized layer can be crystallized, or crystallizability thereof may be increased to improve reflectivity. The heat treatment can be performed in a temperature range of about 300° C. to about 800° C.

Next, as shown in FIG. 4C, the carrier substrate 30 is removed, and then the light-emitting diode chip C, on which the reflective layer 24a is formed, is flipped over so that the light-emitting surface LE thereof faces upward. Thus, as described above, the light-emitting diode chip C including the reflective layer 24a can be manufactured.

Figure 5A:
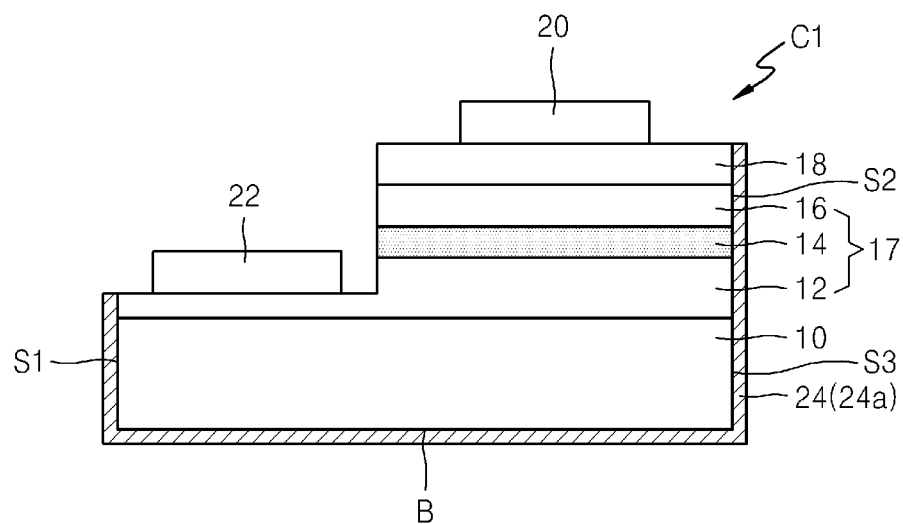
FIGS. 5A and 5B are cross-sectional views illustrating the light-emitting diode chip including the reflective layer, according to an embodiment of the inventive concept.
Figure 5B:
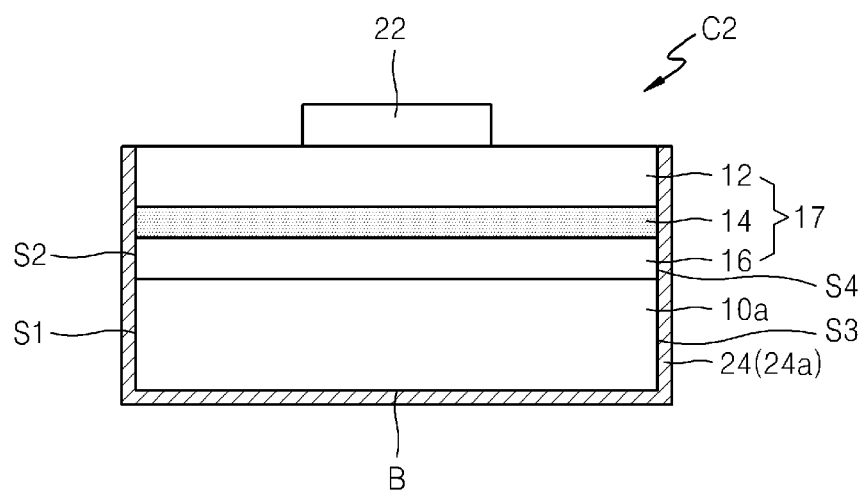
Figure 5C:
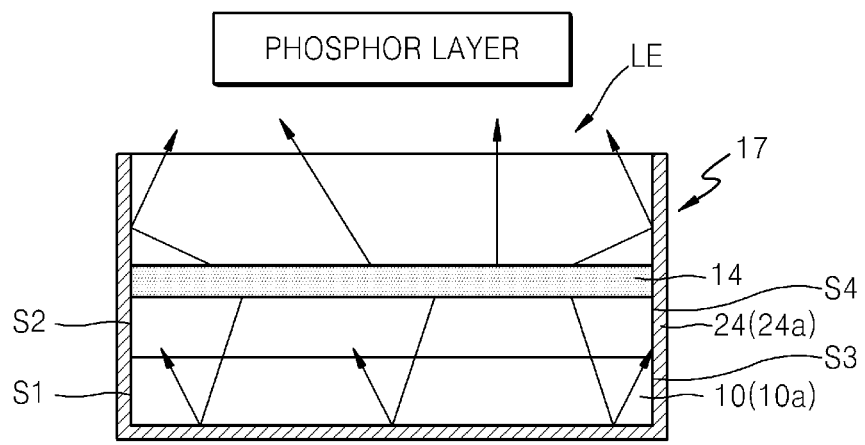
FIG. 5C is a schematic view illustrating how light is reflected by the exemplary reflective layers of FIGS. 5A and 5B.

FIGS. 5A and 5B illustrate the light-emitting diode chip including the reflective layer, according to exemplary embodiments of the inventive concept. FIG. 5C illustrates how light is reflected by the reflective layers of FIGS. 5A and 5B.

Specifically, FIGS. 5A and 5B illustrate an example of forming the reflective layers 24 and 24a on the light-emitting diode chip C of FIGS. 2a through 2c.

As illustrated in FIGS. 5A and 5B, the reflective layers 24 and 24a are formed on side surfaces S1 and S3, the rear surface B of the supporting layer 10, a supporting layer 10a, and the side surface S2 of the light-emitting structure 17 shown in FIG. 5A (or side surfaces S2 and S4 of the light-emitting structure 17 shown in FIG. 5B). The reflective layers 24 and 24a may be formed in a uniform layer along the rear surface B of the supporting layers 10 and 10a, the side surfaces S1 and S3 of the supporting layer 10, the side surfaces S2 and S4 of the light-emitting structure 17. Since the method of forming the reflective layers 24 and 24a is identical to the method described earlier, the detailed description thereof is omitted.

As illustrated in FIG. 5C, with the light-emitting surface LE of the light-emitting diode chip C excluded, when the reflective layers 24 (24a) are formed on the side surface 51, S3, and the rear surface B of the supporting layers 10 (10a), and the surfaces S2 and S4 of the light-emitting structure 17, the reflective layers 24 (24a) may be used to redirect the light emitted from the active layer 14 of the light-emitting structure 17 toward a phosphor layer, that is, to an upper surface or upward. Therefore, according to the exemplary embodiment of the inventive concept, light emitted from the active layer 14 may be extracted more efficiently.

Hereinafter, various methods of packaging a light-emitting diode chip will be described below. However, the methods are not limited thereto, and may be modified in various ways.

Figure 6:
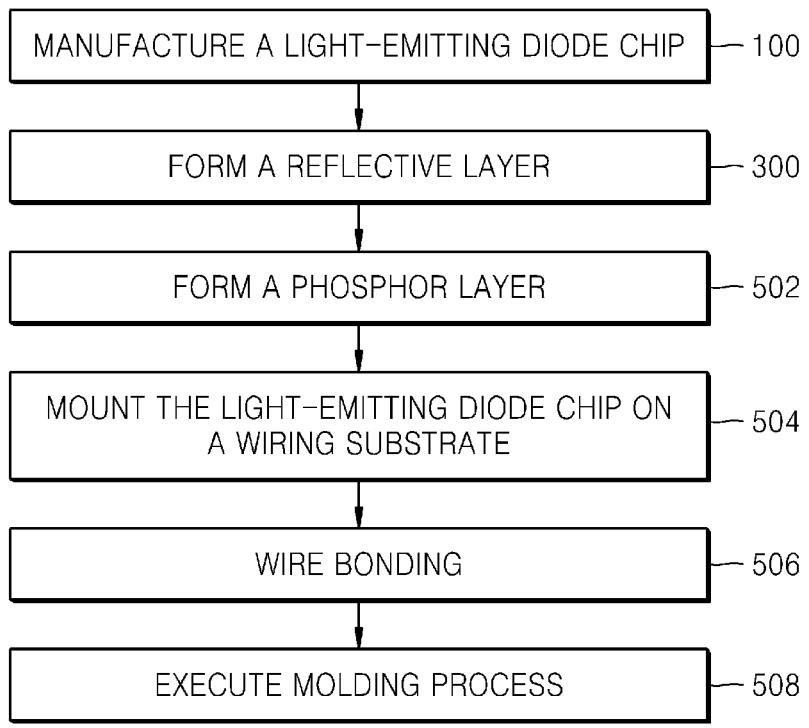
FIG. 6 is a flowchart illustrating the method of manufacturing the light-emitting diode package of FIG. 1, according to an embodiment of the inventive concept.

FIG. 6 is a flowchart illustrating the method of manufacturing the light-emitting diode package, according to an embodiment of the inventive concept. FIGS. 7A through 7D are cross-sectional views illustrating the packaging process of FIG. 6. For the *sake* of convenience, in FIGS. 7A through 7D, the reference numeral 24 will designate the reflective layer.

Figure 7A:
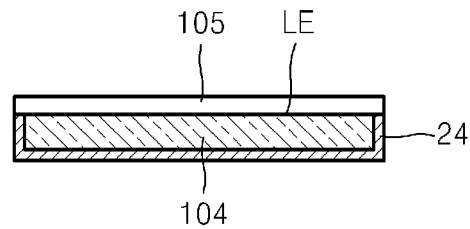
FIGS. 7A through 7D are cross-sectional views illustrating the packaging process shown in FIG. 6.

As shown in FIGS. 6 and 7A, by manufacturing a light-emitting diode chip (operation 100) and forming a reflective layer (operation 300), a light-emitting diode chip 104 including the reflective layer 24 is prepared. A phosphor layer 105 is formed on the light-emitting surface LE and the reflective layer 24 of the light-emitting diode chip 104 (operation 502). The phosphor layer 105 is formed in a state exposing an electrode pad (not shown), which is formed on the upper surface of the light-emitting diode chip 104.

In the exemplary embodiment, the phosphor layer 105 may be formed by using a spray coating method, film-attaching method, dispense method, or screen printing method, or etc. The phosphor layer 105 may also be formed by dispersing phosphor on a light-transmitting resin, such as a silicon resin or an epoxy resin. If the light-emitting diode chip 104 is a blue light-emitting diode chip, the phosphor included in the light-transmitting resin may include at least one material selected from the group consisting of a garnet-based (YAG, TAG, LuAG) material, a silicate-based material, a nitride-based material, and an oxynitride-based material.

Although natural light (white light) may be generated by only including yellow-type phosphor in the light-transmitting resin, to increase color rendering index and reduce color temperatures, green-type or red-type phosphors may be additionally included. In addition, when various color types of phosphors are combined in the light-transmitting resin, the green-type phosphor may be used more than the red-type phosphor, and the yellow-type phosphor may be used more than the green-type phosphor.

The garnet-based (YAG, TAG, LuAG) material, the silicate-based material, and the oxynitride-based material may be included in yellow-type and green-type phosphors, and the nitride-based material may be included in the red-type phosphor. Instead of combining various color types of phosphors in the light-transmitting resin, the light-transmitting resin may be made up of separate phosphor layers, that is, a layer of the red-type phosphor, a layer of the green-type phosphor, and a layer of the yellow-type phosphor.

Figure 7B:
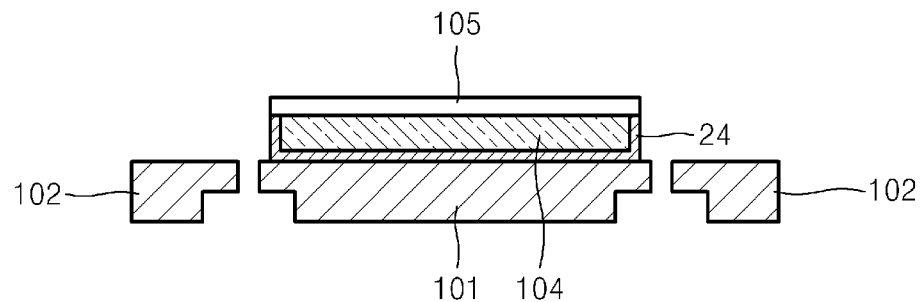

Referring to FIG. 7B, a wiring substrate 102 such as a lead frame is prepared. Although the lead frame is set as an example of the wiring substrate 102 in the present embodiment, the wiring substrate 102 is not limited thereto. For example, the wiring substrate 102 may be a silicon substrate, an aluminum oxide ($Al_2O_3$) substrate, or an aluminum nitride (AlN) substrate. The wiring substrate 102 may be an insulating layer having a circuit pattern printed thereon, such as in the case of a general printed circuit board (PCB), a metal core PCB, a flexible PCB, or a ceramic PCB. The wiring substrate 102 may be formed using a material that efficiently reflects light, or the surface of the wiring substrate 102 may include a color that efficiently reflects light, such as white or silver.

A heat-radiating pad 101 (or a mounting member) on which the light-emitting diode chip 104 is mounted may be disposed in the wiring substrate 102. The heat-radiating pad 101 may be a mounting member on which the light-emitting diode chip 104 is mounted. When the phosphor layer 105 is formed facing upward, the light-emitting diode chip 104 is attached on the heat-radiating pad 101 using an adhesive (not shown) (operation 504).

Figure 7C:
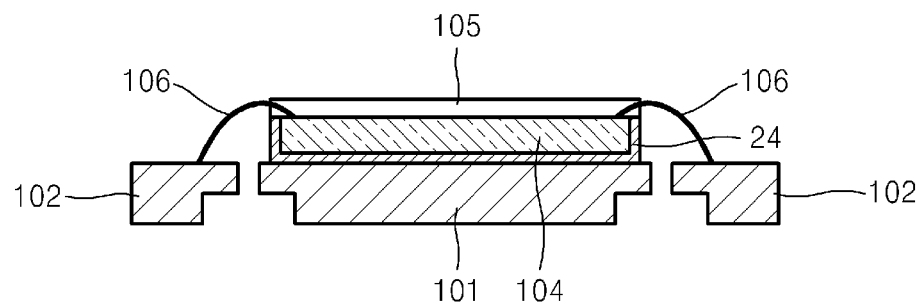

Referring to FIG. 7C, the light-emitting diode chip 104 including the phosphor layer 105 and the wiring substrate 102 are connected to each other using electrical connecting members 106, such as bonding wires 106. That is, an electrode pad (not shown) of the light-emitting diode chip 104 and the wiring substrate 102 are connected using the electrical connecting members 106 (operation 506 shown in FIG. 6).

Figure 7D:
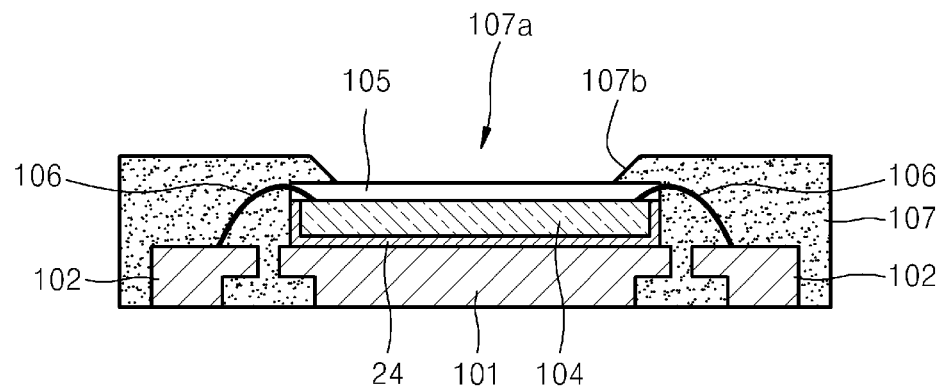

Referring to FIG. 7D, a molding material 107, which molds and encapsulates, that is, surrounding the light-emitting diode chip 104 to cover the both sides (or side surfaces) of the phosphor layer 105 while exposing the light-emitting surface LE (operation 508 shown in FIG. 6). In addition, in an open area 107a, the molding material 107 forms a slanted reflective cup 107b. The molding material 107 further surrounds and fixes the heat-radiating pad 101 and the wiring substrate 102, and completely surrounds all sides of the light-emitting diode chip 104. As noted above, the molding material 107 is formed such that the electrical connecting members 106 are buried within the molding material while exposing the light-emitting surface LE of the light-emitting diode chip 104.

For example, the heat-radiating pad 101, on which the light-emitting diode chip 104 including the electrical connecting members 106 is mounted, and the wiring substrate 102, e.g., a lead frame, are disposed inside the mold. In the exemplary embodiment, by using a transfer molding method, the molding material 107 can be formed. In this regard, upper portions of wiring substrate 102 and the electrical connecting members 106 may be completely buried in the molding material 107, and the upper surface of the light-emitting diode chip 104 may be exposed through the slanted reflective cup 107b. The bottom surfaces of the wiring substrate 102 and the heat-radiating pad 101 may be exposed through the bottom surface of the molding material 107. Also, the molding material 107 may be formed using a white molding material having high light-reflectivity.

Figure 8:
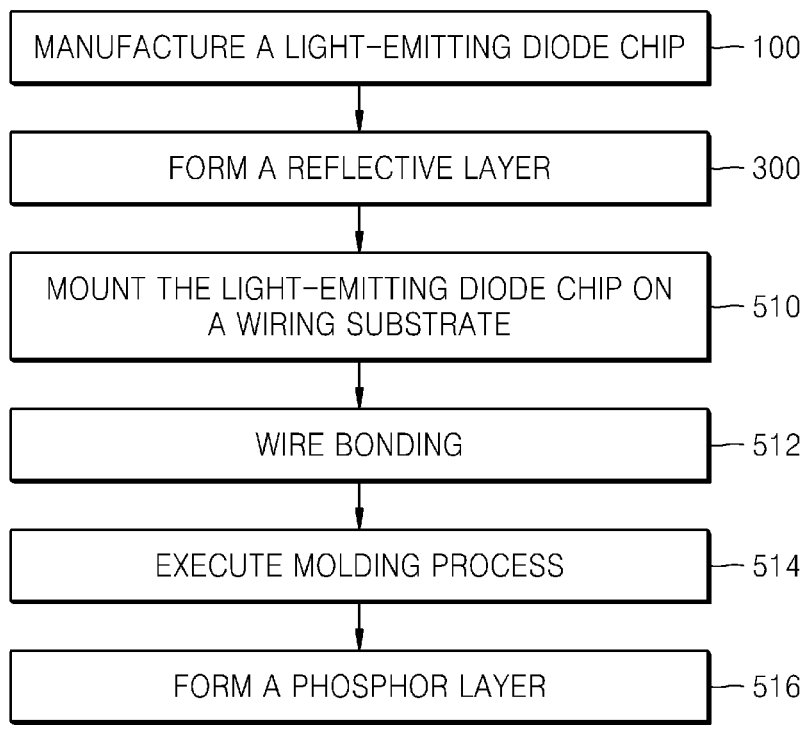
FIG. 8 is a flowchart illustrating an exemplary method of manufacturing the light-emitting diode package of FIG. 1, according to an embodiment of the inventive concept.

FIG. 8 is a flowchart illustrating another exemplary method of manufacturing the light-emitting diode package, according to an embodiment of the inventive concept. FIGS. 9A through 9D are cross-sectional views illustrating the exemplary packaging process of FIG. 8.

In comparison to the packaging processes illustrated in FIGS. 6 and 7A through 7D, the packaging processes illustrated in FIG. 8 and in FIGS. 9A through 9D are identical to the packaging processes described earlier, except for the forming of the phosphor layer 105 (operation 516 shown in FIG. 8) that follows the molding process (operation 514 shown in FIG. 8).

Figure 9A:
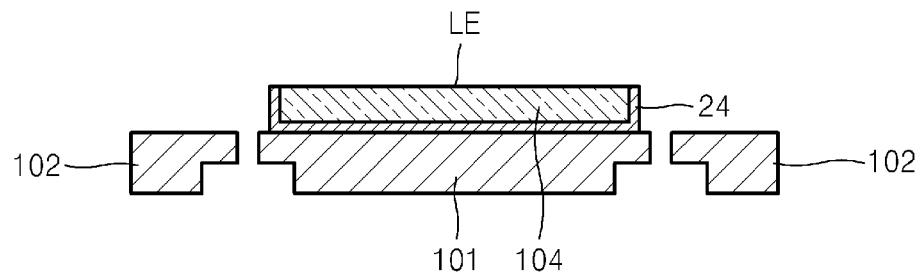
FIGS. 9A through 9D are cross-sectional views illustrating the packaging process shown in FIG. 8.

Referring to FIG. 9A, the light-emitting diode chip 104, which includes the reflective layer 24, is mounted on the heat radiating pad 101, such as the lead frame (operation 510 shown in FIG. 8). With the light-emitting surface LE facing upward, the light-emitting diode chip 104 is attached on the heat-radiating pad 101 by using an adhesive.

Figure 9B:
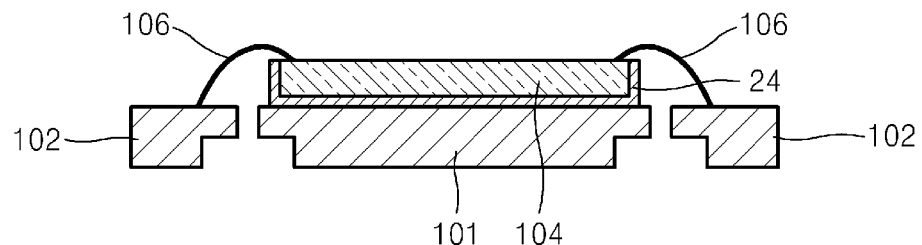

Referring to FIG. 9B, the light-emitting diode chip 104 and the wiring substrate 102 are connected using the electrical connecting members 106 such as bonding wires. That is, the electrode pads of the light-emitting diode chip 104 and the wiring substrate 102 are connected via the electrical connecting members 106 (operation 512 shown in FIG. 8).

Figure 9C:
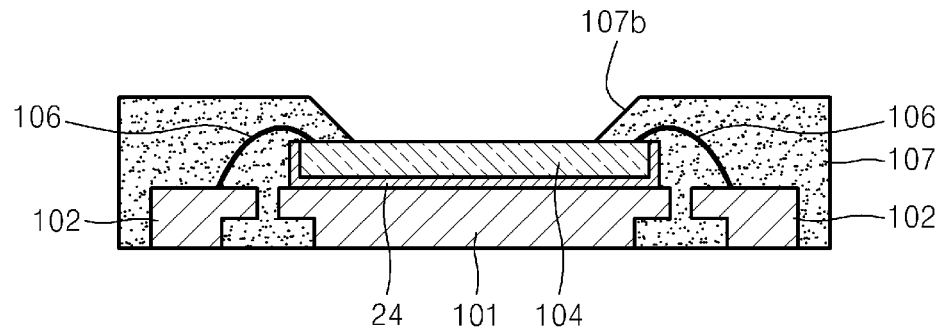

Referring to FIG. 9C, the molding material 107, which is molded to surround the light-emitting diode chip 104 while exposing its light-emitting surface LE, is formed (operation 514 shown in FIG. 8). Since the forming process of the molding material 107 is described earlier, the detailed description thereof will be omitted.

Figure 9D:
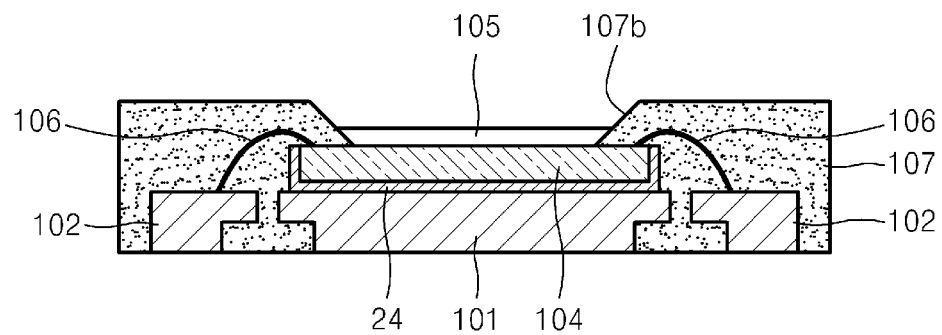

Referring to FIG. 9D, the phosphor layer 105 is formed on the light-emitting surface LE of the light-emitting diode chip 104 and the upper surfaces of the molding material 107 (operation 516 shown in FIG. 8). In this exemplary embodiment, in the case where the phosphor layer 105 is formed after the molding material 107 is formed, the phosphor layer 105 may be formed to be much more stable. That is, when the phosphor layer 105 is formed after forming the molding material 107, the phosphor layer 105 may be formed to be much more stable in the inner portion of the reflective cup 107b and the upper surfaces of the light-emitting diode chip 104.

Figure 10:
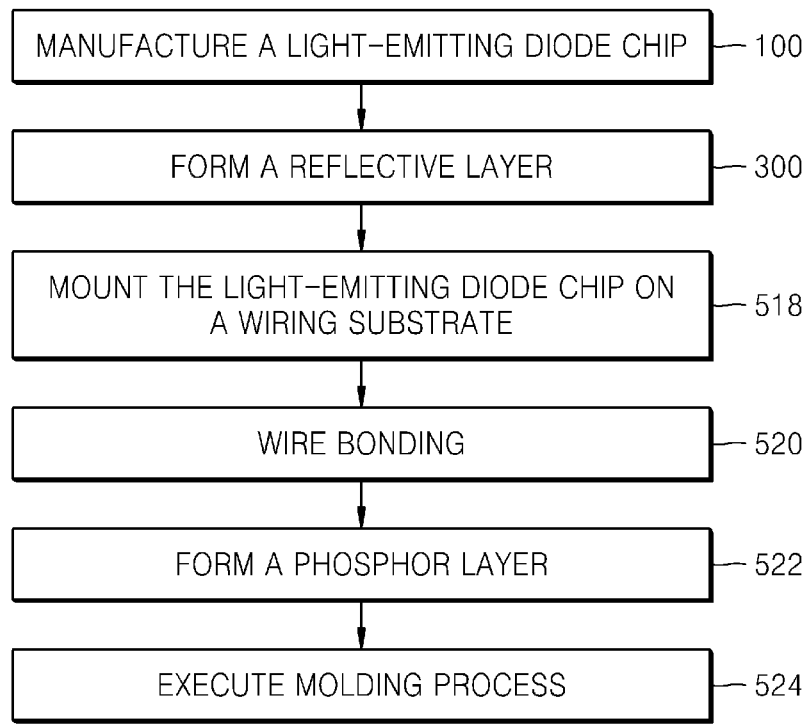
FIG. 10 is a flowchart illustrating an exemplary method of manufacturing the light-emitting diode package of FIG. 1, according to an embodiment of the inventive concept.
Figure 11A:
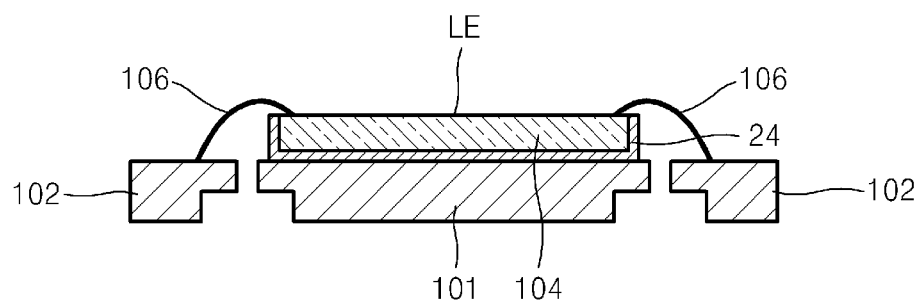
FIGS. 11A and 11B are cross-sectional views illustrating the packaging process shown in FIG. 10.
Figure 11B:
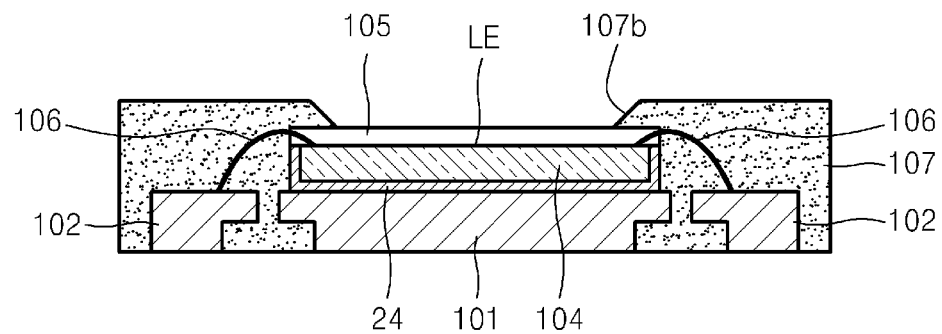

FIG. 10 is a flowchart illustrating operations of the method of manufacturing the light-emitting diode package, according to an embodiment of the inventive concept. FIGS. 11A and 11B are cross-sectional views illustrating the packaging process of FIG. 10.

In comparison to the packaging processes illustrated with reference to FIG. 6 and FIGS. 7A through 7D, FIG. 8 and FIGS. 9A through 9D, the packaging processes illustrated in FIG. 10 and in FIGS. 11A and 11B are identical to the packaging processes described earlier, except that the phosphor layer 105 is formed after the bonding wires 106 are used to connect the light-emitting diode chip 104 and the wiring substrate 102 as shown in FIGS. 10 and 11A.

Referring to FIG. 11A, the light-emitting diode chip 104 includes the reflective layer 24 and is mounted on the wiring substrate 102 such as the lead frame (operation 518 shown in FIG. 10). With the light-emitting surface LE facing upward, the light-emitting diode chip 104 is attached on the heat-radiating pad 101 by using an adhesive.

The light-emitting diode chip 104 and the wiring substrate 102 are connected using the electrical connecting members 106, such as bonding wires. That is, the electrode pads of the light-emitting diode chip 104 and the wiring substrate 102 are connected using the electrical connecting members 106 (operation 520 shown in FIG. 10).

Referring to FIG. 11B, the phosphor layer 105 is formed on the light-emitting surface LE and the reflective layer 24 (operation 522 in shown FIG. 10). Since the phosphor layer 105 is formed on the light-emitting diode chip 104 including the electrical connecting members 106, the complicated process of exposing the electrode pad when forming the phosphor layer 105 may be omitted.

Next, the molding material 107, which surrounds the light-emitting diode chip 104 and covers the side surfaces of the light-emitting diode chip 104 while exposing the phosphor layer 105, is formed (operation 524 shown in FIG. 10). Since the forming process of the molding material 107 is described earlier, detailed description thereof will be omitted.

Figure 12:
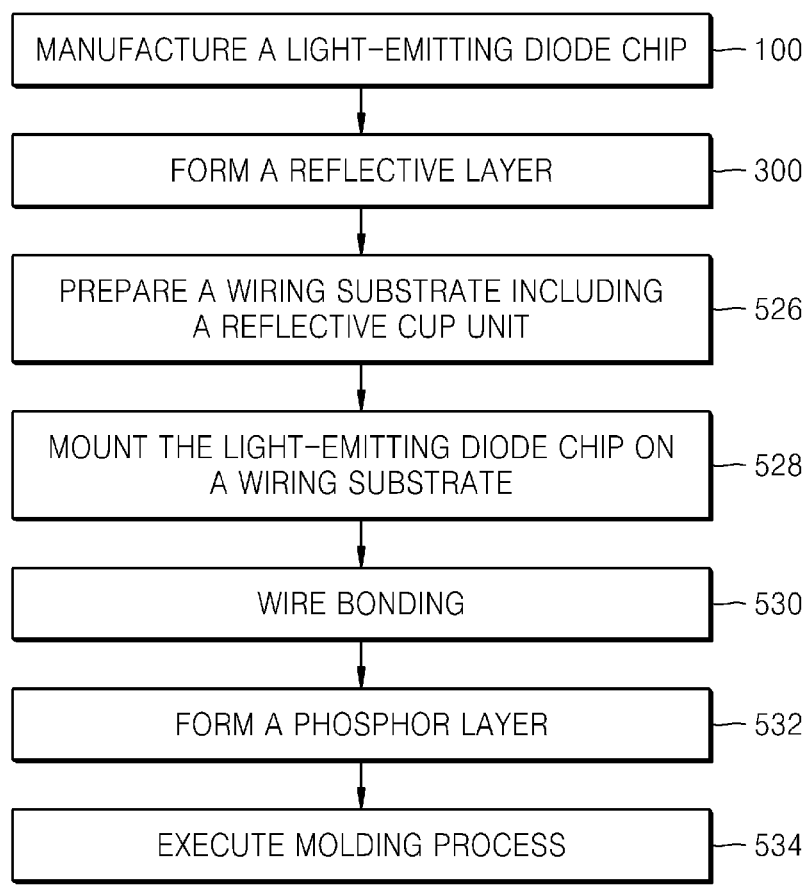
FIG. 12 is a flowchart illustrating an exemplary method of manufacturing the light-emitting diode package of FIG. 1, according to an embodiment of the inventive concept.
Figure 13:
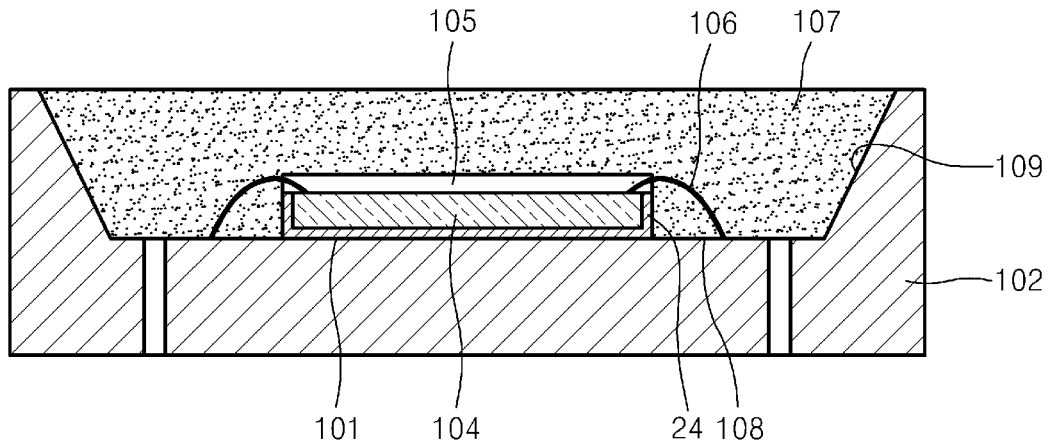
FIG. 13 is a cross-sectional view illustrating an example of the packaging process shown in FIG. 12.

FIG. 12 is a flowchart illustrating another exemplary method of manufacturing the light-emitting diode package, according to an embodiment of the inventive concept. FIG. 13 is a cross-sectional view illustrating an example of the light emitting diode chip package according to the exemplary method described in FIG. 12.

The packaging processes illustrated in FIGS. 12 and 13 are identical to the processes described earlier with respect to FIGS. 10, 11A and 11B, except for an inclusion of reflective cup 109 in the wiring substrate 102 and forming the molding material 107 in the reflective cup 109.

Referring to FIG. 13, the light-emitting diode chip 104 including the reflective layer 24 is manufactured as described earlier (operations 100 and 300 shown in FIG. 12). Next, the wiring substrate 102 including the reflective cup 109 is prepared (operation 526 shown in FIG. 12). The wiring substrate 102 may include a mounting member 101, on a surface of which the light-emitting diode chip 104 is mounted, a flat surface member 108 which is a flat surface extending to the side surfaces of the mounting member 101, and the reflective cup 109 which extends upward from the flat surface member 108.

Furthermore, the light-emitting diode chip 104 is mounted on the mounting member 101 of the wiring substrate 102, disposed inside the reflective cup 109, and packaged. The light-emitting diode chip 104 is connected to the wiring substrate 102 via electrical connecting members 106 (operation 530 shown in FIG. 12). The phosphor layer 105 is formed on the light-emitting surface LE and the reflective layer 24 (operation 532 shown in FIG. 12). The molding material 107 is formed to mold around the light-emitting diode chip 104 to bury the inner portion of the reflective cup 109 (operation 534 shown in FIG. 12).

Figure 14:
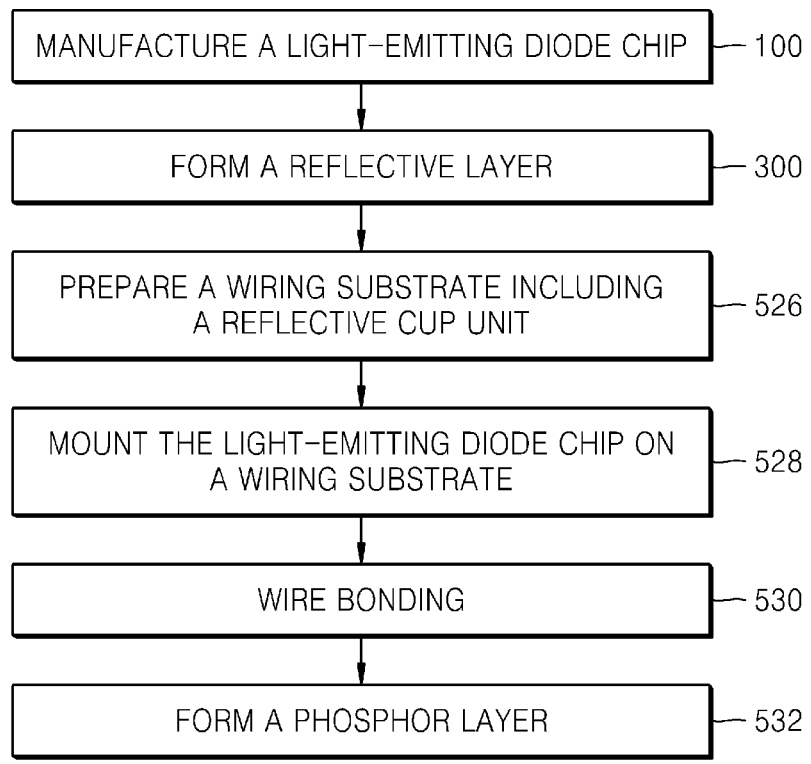
FIG. 14 is a flowchart illustrating an exemplary method of manufacturing the light-emitting diode package of FIG. 1, according to an embodiment of the inventive concept.
Figure 15:
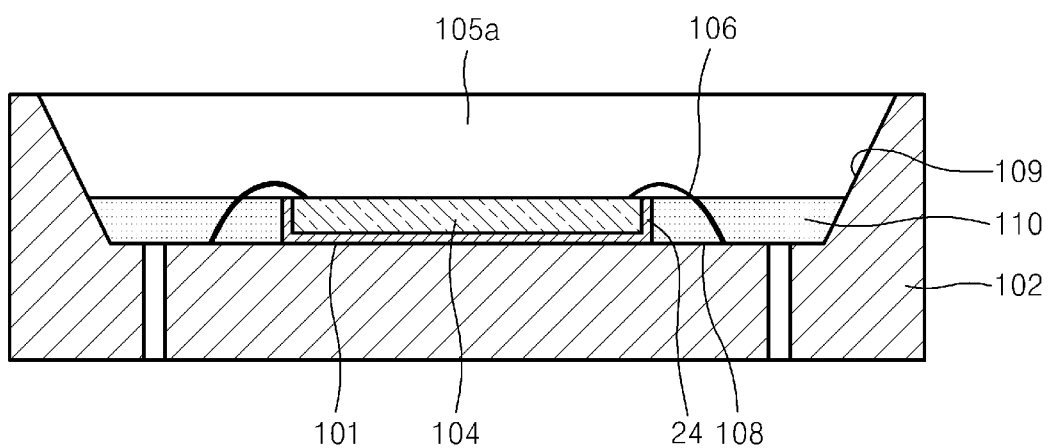
FIG. 15 is a cross-sectional view illustrating an example of the packaging process shown in FIG. 14.

FIG. 14 is a flowchart illustrating another exemplary method of manufacturing the light-emitting diode package, according to an embodiment of the inventive concept. FIG. 15 is a cross-sectional view illustrating an example of the light-emitting diode package according to the exemplary method of FIG. 14.

The packaging processes illustrated in FIGS. 14 and 15 are identical to the packaging processes described earlier, with respect to FIGS. 12 and 13, except for the forming of a phosphor layer 105a in the reflective cup 109 and the omission of a step of forming the molding material.

Referring to FIG. 14, the light-emitting diode chip 104 including the reflective layer 24 is manufactured as described earlier (operations 100 and 300 shown in FIG. 14). Next, the wiring substrate 102 including the reflective cup 109 is prepared (operation 526 shown in FIG. 14). As shown in FIG. 15, the wiring substrate 102 includes a mounting member 101, on a surface of which the light-emitting diode chip 104 is mounted, a flat surface member 108, which is a flat surface extending towards the both sides of the mounting member 101, and the reflective cup 109, which extends upward from the flat surface member 108.

Furthermore, the light-emitting diode chip 104 is mounted on the mounting member 101 of the wiring substrate 102 (operation 528 shown in FIG. 14) and packaged. That is, the light-emitting diode chip 104 and the wiring substrate 102 are connected by using electrical connecting members 106 (operation 530 shown in FIG. 14), and a second reflective layer 110 is formed on the flat surface member 108. The second reflective layer 110 may be formed using the same materials as that of the reflective layer 24 described earlier. When the second reflective layer 110 is formed, more light may be emitted upward. Next, as shown in FIG. 15, the phosphor layer 105a is formed to bury or fill the area in the reflective cup 109, which is above light-emitting surface LE, the reflective layer 24, and the second reflective layer 110. The phosphor layer 105a may be formed using the same material as that of the phosphor layer 105.

Figure 16A:
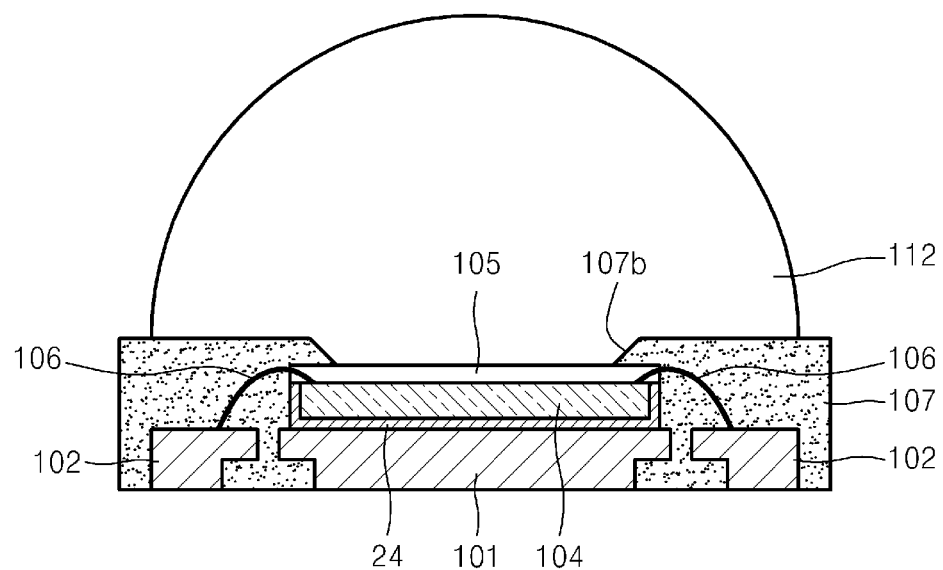
FIGS. 16A and 16B are cross-sectional views illustrating an exemplary light-emitting diode package according to an embodiment of the inventive concept.
Figure 16B:
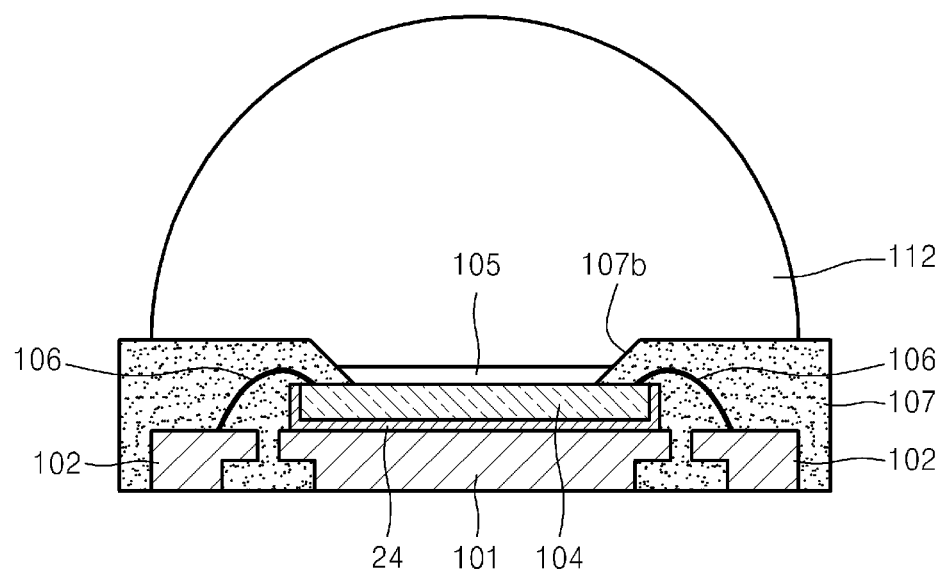

FIGS. 16A and 16B are cross-sectional views illustrating a light-emitting diode package according to another exemplary embodiment of the inventive concept.

The light-emitting diode package of FIG. 16A is manufactured by forming a transparent encapsulating member 112 on and/or above the molding material 107 of FIG. 7D. The light-emitting diode package of FIG. 16B is manufactured by forming the transparent encapsulating member 112 on and/or above the molding material 107 of FIG. 9D. In FIGS. 16A and 16B, the upper surface of the light-emitting diode chip is electrically connected to the wiring substrate 102 by using two electrical connecting members 106.

However, if the light-emitting diode chip is a vertical light-emitting diode chip, the upper surface of the light-emitting diode chip is electrically connected to the wiring substrate 102 by using only one electrical connecting member 106 (not shown). Also, as described earlier, the metal layer or conductive material layer of the bottom surface of the light-emitting diode chip may be used as an electrode pad.

While particular exemplary embodiments of the inventive concept have been particularly shown and described herein, it will be understood that various changes in form and details may be made therein without departing from the spirit and scope of the following claims.

It is understood that any specific order or hierarchy of steps in the processes described is an illustration of example approaches. Based upon design preferences, it is understood that the specific order or hierarchy of steps in the processes can be rearranged, or that all illustrated steps be performed. Some of the steps can be performed simultaneously.

The word "example" is used herein to mean "serving as an example or illustration." Any aspect or technique described herein as "example" is not necessarily to be construed as preferred or advantageous over other aspects or techniques.

What is claimed is:

1. A method of manufacturing a light-emitting diode package, the method comprising:
    dicing a wafer to obtain a light-emitting diode chip including side surfaces, a light-emitting surface, and a rear surface opposed to the light-emitting surface of the light-emitting diode chip;
    mounting the light-emitting diode chip on a carrier substrate, such that the light-emitting surface of the light-emitting diode chip is facing toward the carrier substrate;
    after mounting the light-emitting diode chip on the carrier substrate, forming a material layer on the side surfaces and the rear surface of the light-emitting diode chip;
    oxidizing the material layer to convert the material layer into an oxidized layer to form a reflective layer on the side surfaces and the rear surface of the light-emitting diode chip; and
    packaging the light-emitting diode chip.

2. The method of claim 1, wherein the light-emitting diode chip is manufactured by forming a light-emitting structure on a supporting layer, and
    wherein the reflective layer is formed on side surfaces and a rear surface of the supporting layer and side surfaces of the light-emitting structure.

3. The method of claim 2, wherein the reflective layer is formed in a continuous layer along the rear surface of the supporting layer, the side surfaces of the supporting layer and the side surfaces of the light-emitting structure.

4. The method of claim 2, wherein the supporting layer is a substrate for epitaxial growth, a metal layer or a conductive material layer.

5. The method of claim 1, further comprising removing the carrier substrate after forming the reflective layer.

6. The method of claim 5, further comprising performing heat treatment on the reflective layer, after the forming of the reflective layer.

7. The method of claim 1, wherein the packaging of the light-emitting diode chip comprises:
    forming a phosphor layer on the light-emitting surface of the light-emitting diode chip;
    mounting the light-emitting diode chip on a wiring substrate, such that the phosphor layer of the light-emitting diode chip is facing upward;
    electrically connecting the light-emitting diode chip, which has the phosphor layer formed thereon, and the wiring substrate by using an electrical connecting member; and
    forming a molding material for molding around the light-emitting diode chip to cover side surfaces of the phosphor layer while exposing the light-emitting surface of the light-emitting diode chip.

8. The method of claim 1, wherein the packaging of the light-emitting diode chip comprises:
    mounting the light-emitting diode chip on a wiring substrate such that a phosphor layer of the light-emitting diode chip is facing upward;
    electrically connecting the light-emitting diode chip and the wiring substrate by using an electrical connecting member;
    forming a molding material for molding around the light-emitting diode chip to cover side surfaces of the phosphor layer while exposing the light-emitting surface of the light-emitting diode chip; and
    forming a phosphor layer on the light-emitting surface and both sides of the molding material.

9. The method of claim 1, wherein the packaging of the light-emitting diode chip comprises:
    mounting the light-emitting diode chip on a wiring substrate such that a phosphor layer of the light-emitting diode chip is facing upward;
    electrically connecting the light-emitting diode chip and the wiring substrate by using an electrical connecting member;
    forming a phosphor layer on the light-emitting surface and the reflective layer; and
    forming a molding material for molding around the light-emitting diode chip to cover side surfaces of the phosphor layer while exposing the light-emitting surface of the light-emitting diode chip.

10. The method of claim 1, wherein the material layer includes a metal layer or a silicon layer.

11. The method of claim 1, wherein the reflective layer is formed on the entire side and rear surfaces of the light-emitting diode chip.

12. A method of manufacturing a light-emitting diode package, the method comprising:
    dicing a wafer to obtain a light-emitting diode chip;
    mounting the light-emitting diode chip on a carrier substrate;
    after mounting the light-emitting diode chip on the carrier substrate, forming a metal layer on side surfaces and a rear surface of the light-emitting diode chip;
    oxidizing the metal layer to convert the metal layer into an oxidized layer to form a reflective layer on the side surfaces and the rear surface of the light-emitting diode chip;
    preparing a wiring substrate including a mounting member, which has a surface on which the light-emitting diode chip is mounted, a flat surface member, which is a flat surface extending from both side surfaces of the mounting member, and a reflective cup, which extends upward from the flat surface member;

mounting the light-emitting diode chip, on which the reflective layer is formed, on the mounting member of the wiring substrate; and packaging the light-emitting diode chip.

13. A method of claim 12, wherein the packaging of the light-emitting diode chip comprises:

mounting the light-emitting diode chip on a wiring substrate such that a phosphor layer of the light-emitting diode chip is facing upward;

electrically connecting the light-emitting diode chip and the wiring substrate by using an electrical connecting member;

forming a phosphor layer on a light-emitting surface of the light-emitting diode chip and the reflective layer; and forming a molding material for molding around the light-emitting diode chip.

14. The method of claim 12, wherein the packaging of the light-emitting diode chip comprises:

mounting the light-emitting diode chip on a wiring substrate such that a phosphor layer of the light-emitting diode chip is facing upward;

electrically connecting the light-emitting diode chip and the wiring substrate by using an electrical connecting member; and forming a phosphor layer on a light-emitting surface of the light-emitting diode chip and the reflective layer.

15. The method of claim 12, further comprising forming a second reflective layer on the flat surface member of the wiring substrate.

16. The method of claim 12, wherein:

the light-emitting diode chip is manufactured by forming a light-emitting structure on a supporting layer, and the reflective layer is formed in a continuous layer along rear surface of the supporting layer, side surfaces of the supporting layer, and side surfaces of the light-emitting structure.

17. The method of claim 12, wherein the reflective layer is formed on the entire side and rear surfaces of the light-emitting diode chip.

18. A method of manufacturing a light-emitting diode package, the method comprising:

dicing a wafer to obtain a light-emitting diode chip including side surfaces, a light-emitting surface, and a rear surface opposed to the light-emitting surface of the light-emitting diode chip;

mounting the light-emitting diode chip on a carrier substrate, such that the light-emitting surface of the light-emitting diode chip is facing toward the carrier substrate and the rear surface of the light-emitting diode chip is facing away from the carrier substrate;

after mounting the light-emitting diode chip on the carrier substrate, forming a reflective layer on the side surfaces and the rear surface of the light-emitting diode chip;

preparing a wiring substrate, wherein:
the wiring substrate includes a mounting member, a flat surface member, and a reflective cup;
the flat surface member extends to side surfaces of the mounting member; and
the reflective cup extends upward from the flat surface member;

mounting the light-emitting diode chip with the reflective layer on the mounting member of the wiring substrate; and packaging the light-emitting diode chip.

19. The method of claim 18, further comprising removing the carrier substrate after forming the reflective layer.

20. The method of claim 18, further comprising:
performing heat treatment on the reflective layer, after the forming of the reflective layer.

21. The method of claim 18, wherein the packaging of the light-emitting diode chip comprises:

mounting the light-emitting diode chip on the wiring substrate such that a phosphor layer of the light-emitting diode chip is facing upward;

electrically connecting the light-emitting diode chip and the wiring substrate by using one or more electrical connecting members; and forming a phosphor layer on a light-emitting surface of the light-emitting diode chip and the reflective layer.

22. The method of claim 21, further comprising:

forming a molding material for molding around the light-emitting diode chip to cover side surfaces of the phosphor layer while exposing the light-emitting surface of the light-emitting diode chip.

23. The method of claim 18, wherein the reflective layer is formed on the entire side and rear surfaces of the light-emitting diode chip.

\* \* \* \* \*